United States Patent
Park et al.

(10) Patent No.: US 6,894,313 B2
(45) Date of Patent: May 17, 2005

(54) CMOS THIN FILM TRANSISTOR AND DISPLAY DEVICE USING THE SAME

(75) Inventors: Ji-Yong Park, Suwon (KR); Jae-Bon Koo, Yongin (KR); Hye-Hyang Park, Suwon (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/756,393

(22) Filed: Jan. 14, 2004

(65) Prior Publication Data

US 2004/0251463 A1 Dec. 16, 2004

(30) Foreign Application Priority Data

Jun. 10, 2003 (KR) ................................ 10-2003-0037246

(51) Int. Cl.⁷ ............................................. H01L 29/15
(52) U.S. Cl. ............................ 257/72; 257/66; 257/71; 438/149
(58) Field of Search ...................... 257/66–72; 438/149, 438/151, 152, 157, 166

(56) References Cited

U.S. PATENT DOCUMENTS

| | | | | |
|---|---|---|---|---|
| 5,615,935 A | | 4/1997 | Beyer et al. ................ 303/195 |
| 6,063,654 A | * | 5/2000 | Ohtani ........................ 438/166 |
| 6,124,603 A | | 9/2000 | Koyama et al. .............. 257/66 |
| 6,492,268 B1 | | 12/2002 | Pyo ............................ 438/687 |
| 6,746,901 B2 | * | 6/2004 | Kasahara et al. ........... 438/149 |
| 2003/0213957 A1 | * | 11/2003 | Yamaguchi et al. .......... 257/64 |

* cited by examiner

*Primary Examiner*—Nathan J. Flynn
*Assistant Examiner*—Scott Wilson
(74) *Attorney, Agent, or Firm*—McGuireWoods LLP

(57) ABSTRACT

A CMOS thin film transistor and a display device using the same the CMOS thin film transistor has improved electrical characteristics, such as, current mobility and threshold voltage. The CMOS thin film transistor is fabricated such that the direction of active channels of the P-type thin film transistor and the direction of active channels of the N-type thin film transistor are different from each other. Primary grain boundaries included in the P-type thin film transistor are angled such that they are at an angle of about 60 to about 120° with respect to an active channel direction. Primary grain boundaries included in the N-type thin film transistor are angled such that they are at an angle of about −30° to about 30°. The active channels are formed in polycrystalline silicon.

22 Claims, 6 Drawing Sheets

US 6,894,313 B2

CMOS THIN FILM TRANSISTOR AND DISPLAY DEVICE USING THE SAME

CROSS-REFERENCED TO RELATED APPLICATION

This application claims the benefit of Korean Patent Application No. 2003-37246, filed on Jun. 10, 2003 in the Korean Patent Office, the disclosure of which is hereby incorporated by reference in its entirety.

BACKGROUND OF THE INVENTION

1. Field of the Invention

The invention relates to a CMOS thin film transistor and a display device using the same, and more particularly, to a CMOS thin film transistor in which there is substantially no difference between the absolute value for current mobility and the absolute value for threshold voltage in a P-type thin film transistor and a N-type thin film transistor, and a display device using the same.

2. Description of Related Art

Generally, circuits using complementary metal oxide semiconductor thin film transistors (CMOS TFT) are used to drive active matrix liquid crystal display (LCD) devices, organic electroluminescent (EL) devices and image sensors. However, the absolute value of the threshold voltage of a thin film transistor (TFT) is generally larger than the absolute value of a threshold voltage of a metal oxide semiconductor (MOS) transistor using a single crystalline semiconductor. Furthermore, an absolute value of the threshold voltage of a N-type thin film transistor is quite different from an absolute value of the threshold voltage of a P-type thin film transistor. For example, the threshold voltage of the P-type thin film transistor is −4 V when the threshold voltage of the N-type thin film transistor is 2 V.

Therefore, large differences in absolute values between the threshold voltage of the P-type thin film transistor and the threshold voltage of the N-type thin film transistor is not desirable for circuit operation. In particular, large differences in absolute values of the threshold voltages of P-type and N-type functions as a big barrier in reducing driving voltage.

For example, a P-type thin film transistor having a large absolute value of threshold voltage does not operate properly at a low driving voltage. That is, the P-type thin film transistor functions only as a manual device such as a resistor and does not operate quickly enough. The driving voltage needs to be high enough to operate the P-type thin film transistor as a manual device.

Particularly, a work function difference between the gate electrode and the intrinsic silicon semiconductor is decreased as much as −0.6 eV in cases where the gate electrode is formed of a material having a work function of 5 eV or less, such as, aluminum. Consequently, the threshold voltage of P-channel TFT is shifted to a negative value, and the threshold voltage of N-channel TFT approaches 0 V. Therefore, the N-type thin film transistor is generally in the on-state.

In the above state, it is desirable that the absolute value of the threshold voltage of the N-type thin film transistor is almost equal to that of the P-type thin film transistor. In case of conventional single crystalline semiconductor integrated circuit technology, the threshold voltage has been controlled using N or P-type impurity doping at a very low concentration of $10^{18}$ atoms/cm$^3$ or less. That is, the threshold voltage has been controlled to an accuracy degree of 0.1 V or less by impurity doping having a concentration of $10^{15}$ to $10^{18}$ atoms/cm$^3$.

However, shift in threshold voltage is not observed even if impurities are added to a concentration of $10^{18}$ atoms/cm$^3$ or less in when a semiconductor which is not a single crystalline semiconductor is used. Furthermore, if the concentration of impurities is $10^{18}$ atoms/cm$^3$ or more, the threshold voltage is rapidly changed, and conductivity becomes p-type or n-type since polycrystalline silicon has many defects. Added impurities are trapped by the defects and not activated since concentration of the defects is $10^{18}$ atoms/cm$^3$. Furthermore, concentration of impurities is larger than concentration of defects, excessive impurities are activated, and conductivity type is changed to n or p-type.

In order to solve these problems, a P-type thin film transistor and a N-type thin film transistor are fabricated in such a way that the length of the channel of the P-type thin film transistor is shorter than the length of the channel of the N-type thin film transistor. U.S. Pat. Nos. 6,492,268, 6,124,603 and 5,615,935 disclose varying the length of N-type and P-type channels. However, there are problems even in the disclosed fabrication process because the process of forming thin film transistors with channels of different length is complicated.

SUMMARY OF THE INVENTION

The invention provides a CMOS thin film transistor having an active channel of a P-type thin film transistor, the active channel being formed in polycrystalline silicon, an active channel of a N-type thin film transistor, the active channel being formed in polycrystalline silicon, primary grain boundaries in the P-type thin film transistor, primary grain boundaries in the N-type thin film transistor. A direction of the active channel of the P-type transistor is different from a direction of the active channel of the N-type transistor such that the primary grain boundaries of the P-type thin film transistor are at an angle of about 60° to about 120° with respect to the active channel direction of the P-type thin film transistor and the primary grain boundaries of the N-type thin film transistor are out an angle of about −30° to about 30° with respect to the active channel direction of the N-type thin film transistor.

The invention provides a CMOS thin film transistor in which a direction of an active channel of P-type thin film transistor and a direction of an active channel of a N-type thin film transistor are different from each other. Primary grain boundaries of the P-type thin film transistor are angled to an active channel direction at an angle of about 60° to about 120°. Primary grain boundaries of the N-type thin film transistor are angled to the active channel direction at an angle of about −30° to about 30°, and the active channels are formed in polycrystalline silicon.

The invention separately provides a display device using an active channel of a P-type thin film transistor, the active channel being famed in polycrystalline silicon, an active channel of a N-type thin film transistor, the active channel being formed in polycrystalline silicon, primary grain boundaries in the P-type thin film transistor, primary grain boundaries in the N-type thin film transistor. A direction of the active channel of the P-type transistor is different from a direction of the active channel of the N-type transistor such that the primary grain boundaries of the P-type thin film transistor are at an angle of about 60° to about 120° with respect to the active channel direction of the P-type thin film transistor and the primary grain boundaries of the N-type thin film transistor are out an angle of about −30° to about 30° with respect to the active channel direction of the N-type thin film transistor the CMOS thin film transistor is used in the display device.

BRIEF DESCRIPTION OF THE DRAWINGS

Further features and advantages of the invention can be more fully understood from the following detailed description taken in conjunction with the accompanying drawings.

DETAILED DESCRIPTION OF THE INVENTION

Figure 1A:
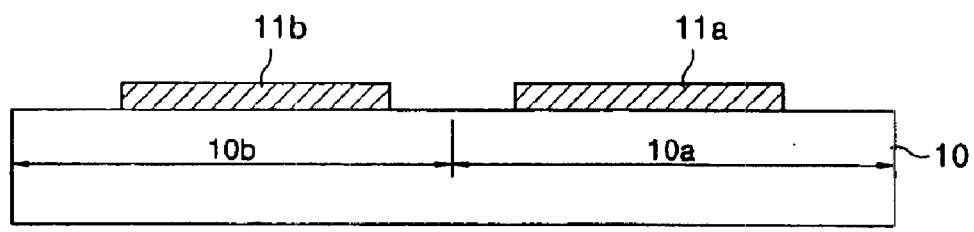
FIGS. 1A, 1B, 1C, 1D, 1E, 1F and 1G sequentially show a process for fabricating a CMOS thin film transistor according to one exemplary embodiment of the invention.

The invention will now be described in detail in connection with exemplary embodiments with reference to the accompanying drawings. For reference, like reference characters designate corresponding parts throughout the description.

FIGS. 1A, 1B, 1C, 1D, 1E, 1F and 1G sequentially show a process for fabricating a CMOS thin film transistor according to one exemplary embodiment of the invention. A discussion of FIG. 1A will immediately follow and a discussion of FIG. 1A will immediately follow and a discussion of FIGS. 1B–1F will be provided later in the detailed description.

As illustrated in FIG. 1A, polysilicon patterns 11a, 11b are respectively formed on a N-type thin film transistor region 10a and a P-type thin film transistor region 10b by positioning a first mask (not illustrated) on a substrate 10 and etching the polysilicon film after a polysilicon film is arranged on a substrate 10. The substrate 10 is equipped with the N-type thin film transistor region 10a and the P-type thin film transistor region 10b.

In case of forming silicon patterns 11a, 11b, a method for arranging grain boundaries and active channel regions is adjusted. A polysilicon film is formed by crystallizing amorphous silicon using a laser. For example, a sequential lateral solidification (SLS) method may be used.

Grain boundaries, (i.e., boundaries between grains) are formed when amorphous silicon is crystallized using a laser. When fabricating a device, the grain boundaries affect current mobility and threshold voltage of the P-type thin film transistor and N-type thin film transistor.

Figure 2A:
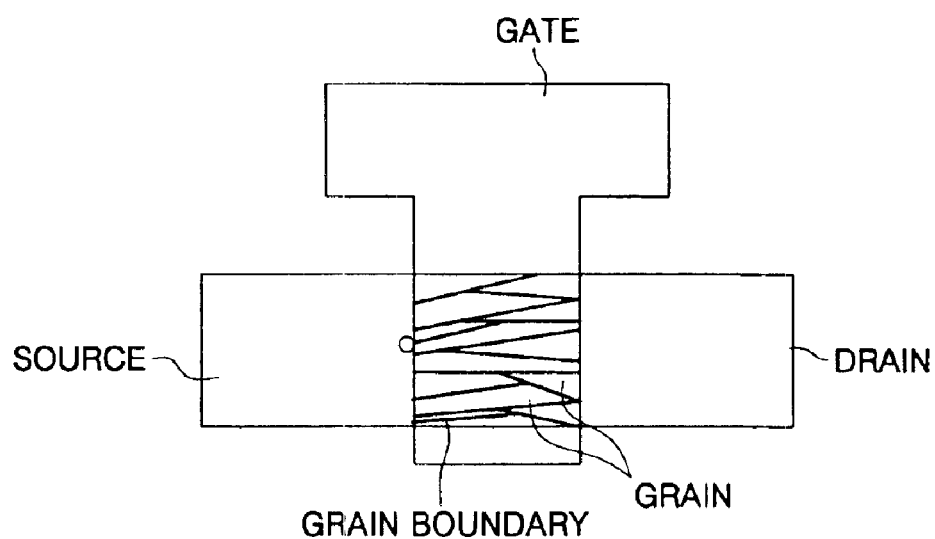
FIG. 2A and FIG. 2B are cross sectional views schematically illustrating a relation between the "primary" grain boundaries included in the active channels of a TFT and the active channels.
Figure 2B:
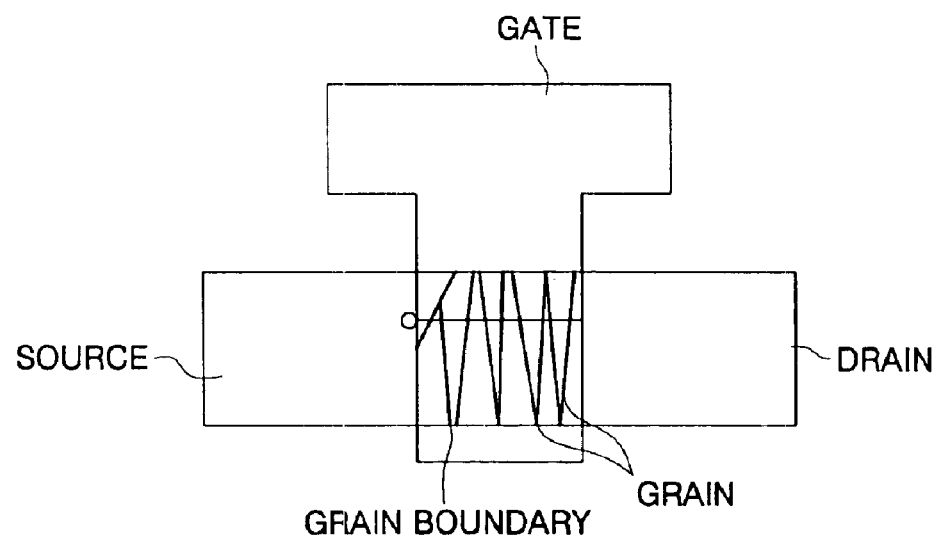

FIG. 2A and FIG. 2B are cross sectional views schematically illustrating a relation between "primary" grain boundaries included in the active channel of a TFT and the active channels.

"Grain size" refers to a distance between confirmable grain boundaries and is defined as a distance between the grain boundaries belonging to an ordinary error range. "Primary" grain boundaries are grain boundaries that are formed almost perpendicularly to a growing direction of polycrystalline silicon grains.

Barrier effect of grain boundaries for electric charge carrier direction is minimized, as illustrated in FIG. 2A, so that TFT characteristics next to single crystalline silicon are obtained when the active channel direction is parallel to the direction of grains grown, for example, by the SLS crystallization method during fabrication of TFT. FIG. 2B illustrates the case when many grain boundaries in which TFT characteristics function as a trap of electric charge carrier exist. As a result of the arrangement shown in FIG. 2B, TFT characteristics are greatly deteriorated when the active channel direction is substantially or entirely perpendicular to the grain growing direction.

That is, when the active channel direction is substantially or entirely perpendicular to the grain boundaries, the grain boundaries are known to be functioning as a trap for the electric charge carrier. Particularly, the higher the number of "primary" grain boundaries formed almost perpendicular to the grain growing direction the higher the risk that the grain boundaries will directly or indirectly fatally affect the TFT characteristics when the polycrystalline silicon is fabricated by SLS.

In various embodiments of the invention, a P-type thin film transistor is generally arranged in such a manner that it has superior electrical properties, and N-type thin film transistor is generally arranged in such a manner that it has electrical properties that are not different from those of the P-type thin film transistor.

In various embodiments of the invention, there is hardly a difference between an absolute value of the threshold voltage of a N-type thin film transistor and an absolute value of the threshold voltage of a P-type thin film transistor. In particular, by adjusting an angle between the "primary" grain boundaries included in an active channel region of a P-type thin film transistor and the "primary" grain boundaries included in an active channel region of a N-type thin film transistor, as well as, the active channel regions of the P-type thin film transistor and N-type thin film transistor the difference between the absolute value of the threshold voltage of a N-type thin film transistor and the absolute value of the threshold voltage of a P-type thin film transistor can be set to be very small. In various embodiments of the invention, the difference between absolute value of threshold voltage of N-type thin film transistor and absolute value of threshold voltage of P-type thin film transistor may be zero or substantially close to zero.

An angle between the "primary" grain boundaries included in active channel region of a N-type thin film transistor and the active channel region of the N-type thin film transistor may generally be about −30 to about 30°, and in various embodiments of the invention may be 0° or substantially close to 0°.

Furthermore, an angle between the "primary" grain boundaries included in the active channel region of a P-type thin film transistor and the active channel region of the P-type thin film transistor is generally about 60° to about 120°, and is typically about 90°.

Figure 3:
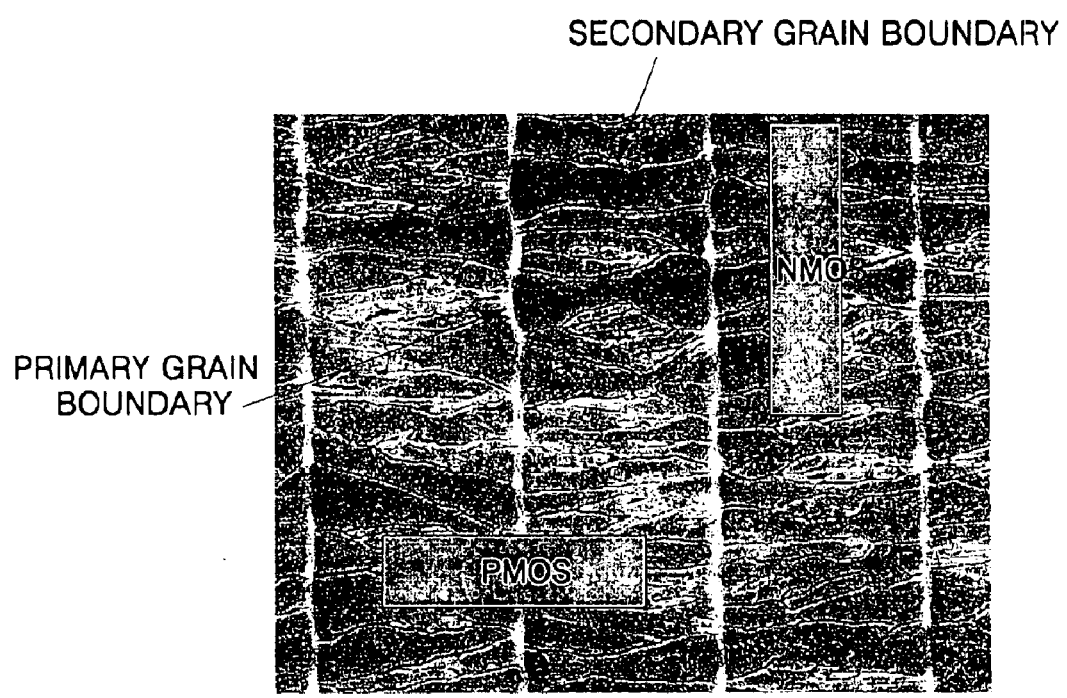
FIG. 3 is a schematic view showing arrangement of a N-type thin film transistor and P-type thin film transistor according to one exemplary embodiment of the invention.

FIG. 3 schematically illustrates a method for arranging a N-type thin film transistor and a P-type thin film transistor according to one exemplary embodiment of the invention. In this exemplary embodiment, the N-type thin film transistor and the P-type thin film transistor are structured in such a manner that the active channel region of the N-type thin film transistor is substantially or completely parallel to the "primary" grain boundaries so that an angle between the active channel region of N-type thin film transistor and the "primary" grain boundaries is substantially or completely 0°, and the active channel region of the P-type thin film transistor is substantially or completely perpendicular to the "primary" grain boundaries so that an angle between the active channel region of the P-type thin film transistor and the "primary" grain boundaries is substantially or completely 90°.

The fabrication method comprises the step of patterning the N-type thin film transistor region and the P-type thin film transistor region so that the N-type thin film transistor region and the P-type thin film transistor region are angled to the active channel regions in an angle of about 0° or about 90°, as described above, after forming polysilicon by crystallizing amorphous silicon.

On the contrary, silicon of the active channel regions of a P-type thin film transistor and a N-type thin film transistor can be crystallized accordingly by varying crystallization of the silicon of the active channel regions of the P-type thin film transistor and the N-type thin film transistor.

Figure 1B:
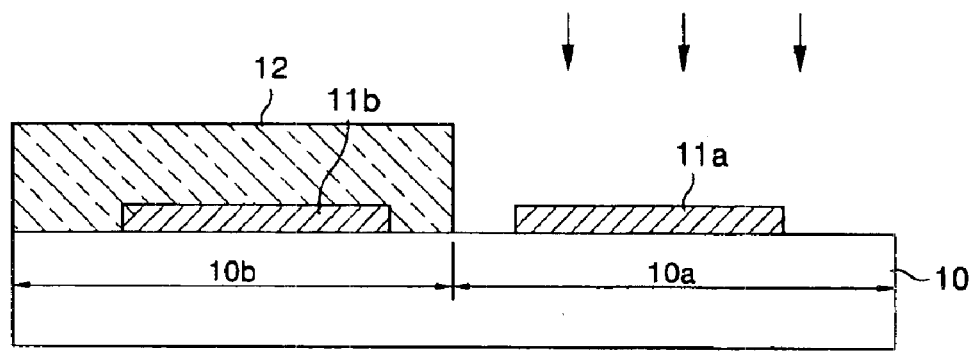

Channel doping is performed on the N-type thin film transistor using a patterned photoresist 12 as a mask after exposing the polysilicon patterns 11a of the channel region 10a of the N-type thin film transistor to give conductivity to the N-type thin film transistor, as illustrated in FIG. 1B, after forming the polysilicon patterns.

A CMOS thin film transistor of the invention generally has a N-type thin film transistor structure, lightly doped drain (LDD) structure or off-set structure, and it is not limited to a particular structure. However, an exemplary process for a CMOS thin film transistor having the LDD structure is described for convenience of description in the present invention as follows.

Figure 1C:
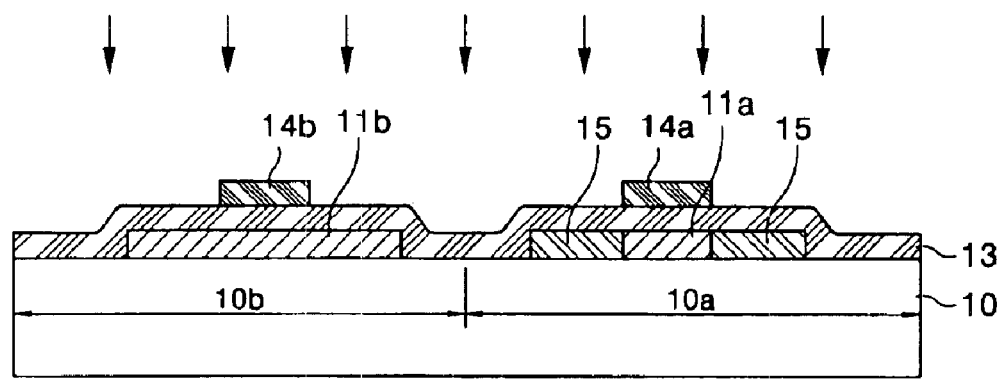

Subsequently, as shown in FIG. 1C the photoresist 12 is removed, and a gate insulation film 13 is formed on the substrate 10. Gate electrode material is then deposited on the upper part of the gate insulation film 13. The gate electrode material is generally formed above a channel region of the thin film transistor such that gate electrodes 14a, 14b are formed. The gate electrodes 14a, 14b are generally formed for the N-type thin film transistor and the P-type thin film transistor, respectively, using a mask (now shown). A low concentration source/drain region 15 is formed at both sides of the gate electrodes 14a by ion injecting N-type low concentration impurities in a polysilicon pattern 11a of the N-type thin film transistor region 10a in order to form the LDD structure.

Figure 1D:
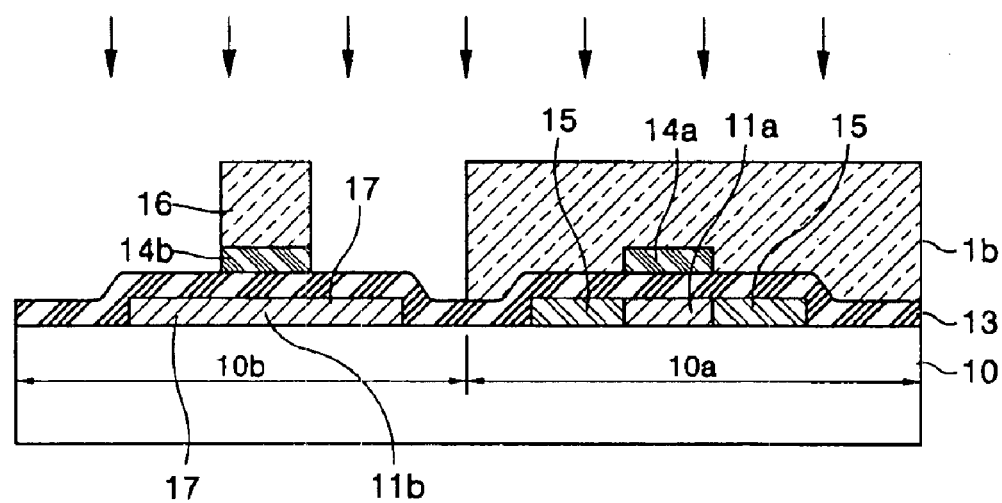

A photolithography process is carried out after the coating photoresist 1b on the front of the substrate 10 on which the low concentration source/drain region 15 is formed, as shown in FIG. 1D. The photoresist 1b covers the N-type thin film transistor region 10a such that impurities are prevented from ion injecting into the N-type thin film transistor region 10a. A mask 16 for forming the source/drain regions of a P-type thin film transistor is formed at the same time. A high concentration of P-type impurities are ion injected in the polysilicon pattern 11b of the P-type thin film transistor region 10b using the mask so that a high concentration source/drain region 17 of the P-type thin film transistor is formed, as illustrated in FIG. 1D.

Figure 1E:
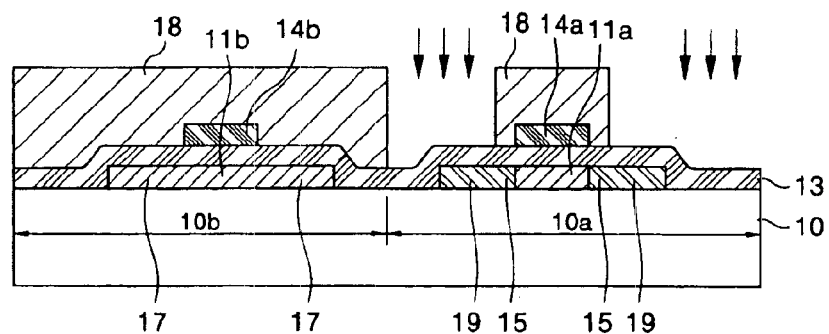

As shown in FIG. 1E, a mask 18 is formed to prevent impurities from ion injecting into the gate electrode of the N-type thin film transistor and the P-type thin film transistor region 10b by performing a photolithography process after removing the mask 16 and coating photoresist 1b on the substrate 10. Next, a high concentration source/drain region 19 is formed by ion injecting N-type high concentration impurities in the polysilicon pattern 11a of the N-type thin film transistor region 10a using the mask 18.

Figure 1F:
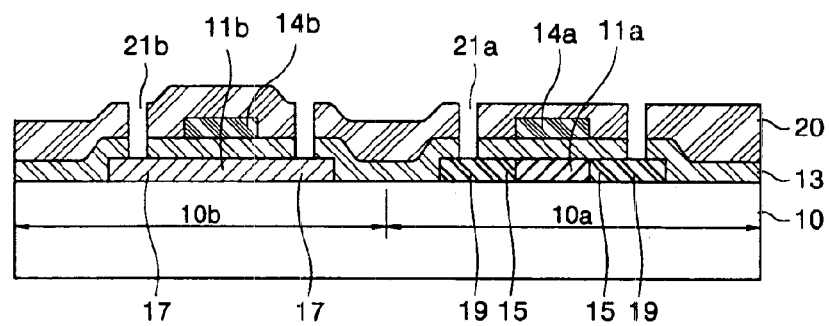

Next, an interlayer insulation film 20 is formed on the front surface of the substrate 10 after removing the mask 18, as illustrated in FIG. 1F. Subsequently, contact holes 21a, 21b are formed on the N-type thin film transistor region 10a and the P-type thin film transistor region 10b, respectively, by positioning a mask (not shown) on the substrate 10 and etching the interlayer insulation film 20 so that source/drain regions 17, 19 of the N-type thin film transistor and the P-type thin film transistor are exposed.

Figure 1G:
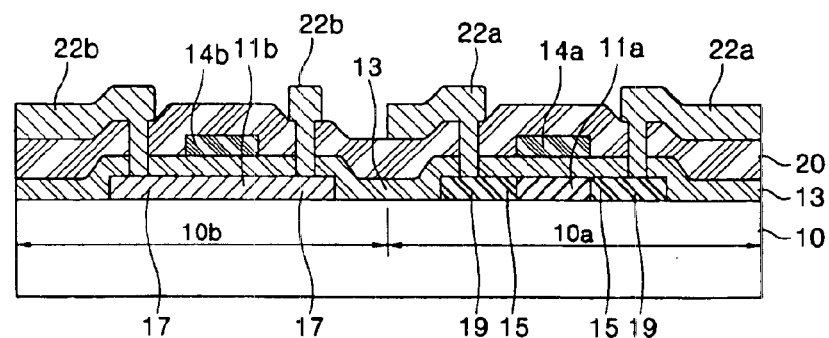

Then, as illustrated in FIG. 1G, source/drain electrodes 22a, 22b of the N-type thin film transistor and the P-type thin film transistor are respectively formed by etching the conductive metallic material using a mask (now shown) depositing a conductive metallic material for forming source/drain electrodes on the front surface of the substrate.

A CMOS thin film transistor comprising a N-type thin film transistor having a LDD structure and a P-type thin film transistor having an ordinary structure is hereby fabricated.

Figure 4A:
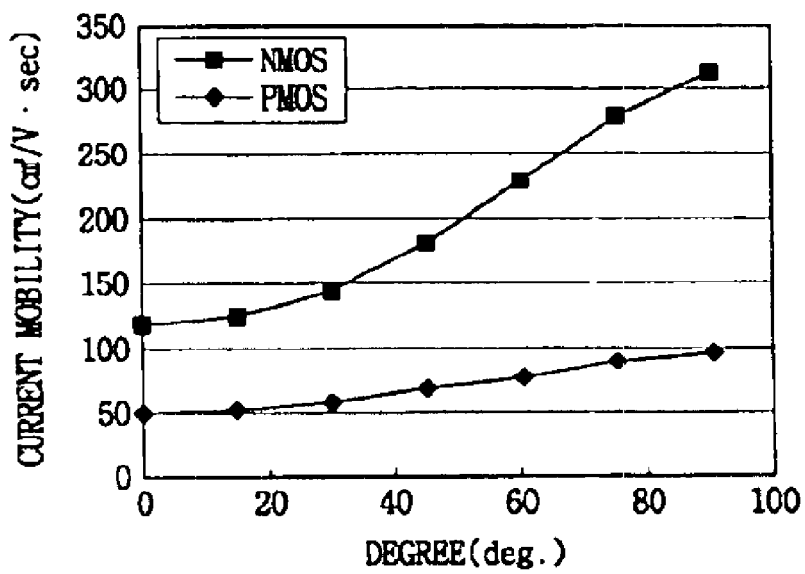
FIG. 4A and FIG. 4B are graphs showing change in current mobility and threshold voltage depending on an angle between "primary" grain boundaries included in an active channel region of a P-type thin film transistor and a N-type thin film transistor having LDD structure of FIG. 1G and active channels.
Figure 4B:
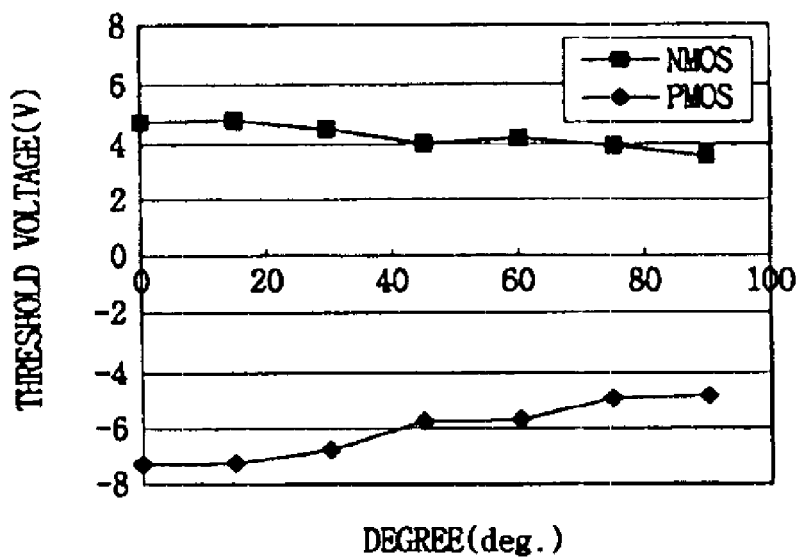

FIG. 4A and FIG. 4B are graphs showing the change of current mobility and threshold voltage based on an angle between the "primary" grain boundaries included in the active channel region of the P-type thin film transistor and the N-type thin film transistor having a LDD structure, as shown in FIG. 1G and the active channels.

It can be seen that there is hardly a difference in current mobility between the N-type transistor and the P-type transistor, as illustrated in FIG. 4A, since current mobility is about 120 $CM^2/V \cdot sec$ when an angle between the N-type thin film transistor and the "primary" grain boundaries is 0°, and the current mobility is about 100 $CM^2/V \cdot sec$ when an angle angled between the P-type thin film transistor and the "primary" grain boundaries is about 90°.

Furthermore, it can be seen that there is hardly a difference in the absolute values of the threshold voltages, as illustrated in FIG. 4B, since the threshold voltage is about 5 V when an angle between the N-type thin film transistor and the "primary" grain boundaries is 0°, and threshold voltage is about −5 V when an angle between the P-type thin film transistor and the "primary" grain boundaries is about 90°.

Therefore, electrical properties of a CMOS thin film transistor are improved since there is either a small or no difference in the absolute values of the threshold voltage and the current mobility when an angle between the N-type thin film transistor and the "primary" grain boundaries is 0°, and an angle between the P-type thin film transistor and the "primary" grain boundaries is about 90°.

In various embodiments of the invention, a CMOS thin film transistor of the invention may be fabricated by varying the number of "primary" grain boundaries included in the active channel regions of the P-type thin film transistor and the N-type thin film transistor and used in a display device, particularly in an active matrix LCD device or an active matrix organic electroluminescent display device.

A CMOS thin film transistor is efficiently driven according to the various principles of the invention by having a higher number of primary grain boundaries included in the active channel region of a N-type thin film transistor than the number of primary grain boundaries included in the active channel region of a P-type thin film transistor. As a result, the electrical properties, such as, current mobility and absolute values of threshold voltage are adjusted.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. A CMOS thin film transistor, comprising:
   an active channel of a P-type thin film transistor, the active channel being formed in polycrystalline silicon,
   an active channel of a N-type thin film transistor, the active channel being formed in polycrystalline silicon,
   primary grain boundaries in the P-type thin film transistor,
   primary grain boundaries in the N-type thin film transistor,
   wherein a direction of the active channel of the P-type transistor is different from a direction of the active channel of the N-type transistor such that the primary grain boundaries of the P-type thin film transistor are at an angle of about 60° to about 120° with respect to the active channel direction of the P-type thin film transistor and the primary grain boundaries of the N-type thin film transistor are out an angle of about −30° to about 30° with respect to the active channel direction of the N-type thin film transistor.

2. The CMOS thin film transistor of claim 1, wherein the P-type thin film transistor is formed such that it has a high current mobility while the N-type thin film transistor is formed such that it has a low current mobility.

3. The CMOS thin film transistor of claim 1, wherein the P-type thin film transistor is formed such that it has a low threshold voltage while the N-type thin film transistor is formed such that it has a high threshold voltage.

4. The CMOS thin film transistor of claim 3, wherein a difference between an absolute value of the threshold voltage of the P-type thin film transistor and an absolute value of the threshold voltage of the N-type thin film transistor is 0.

5. The CMOS thin film transistor of claim 3, wherein a difference between an absolute value of the threshold voltage of the P-type thin film transistor and an absolute value of the threshold voltage of the N-type thin film transistor is substantially zero.

6. The CMOS thin film transistor of claim 1, wherein a length of a channel of the P-type thin film transistor is substantially equal to a length of a channel of the N-type thin film transistor.

7. The CMOS thin film transistor of claim 1, wherein the polycrystalline silicon is fabricated by a sequential lateral solidification (SLS) crystallization method.

8. The CMOS thin film transistor of claim 1, wherein the primary grain boundaries of the P-type thin film transistor are substantially perpendicular to an active channel direction of the P-type thin film transistor, and the primary grain boundaries of the N-type thin film transistor are substantially horizontal to the active channel direction of the N-type thin film transistor.

9. The CMOS thin film transistor of claim 1, wherein the primary grain boundaries of the P-type thin film transistor are perpendicular to an active channel direction of the P-type thin film transistor, and the primary grain boundaries of the N-type thin film transistor are horizontal to the active channel direction of the N-type thin film transistor.

10. The CMOS thin film transistor of claim 1, wherein a majority of the primary grain boundaries of the P-type thin film transistor are substantially perpendicular to an active channel direction of the P-type thin film transistor, and a majority of the primary grain boundaries of the N-type thin film transistor are substantially horizontal to the active channel direction of the N-type thin film transistor.

11. The CMOS thin film transistor of claim 1, wherein the CMOS thin film transistor includes a lightly doped drain (LDD) structure or off set structure.

12. A display device, comprising:
    a CMOS thin film transistor, the CMOS thin film transistor comprising:
    an active channel of a P-type thin film transistor, the active channel being formed in polycrystalline silicon,
    an active channel of a N-type thin film transistor, the active channel being formed in polycrystalline silicon,
    primary grain boundaries in the P-type thin film transistor,
    primary grain boundaries in the N-type thin film transistor, wherein a direction of the active channel of the P-type transistor is different from a direction of the active channel of the N-type transistor such that the primary grain boundaries of the P-type thin film transistor are at an angle of about 60° to about 120° with respect to the active channel direction of the P-type thin film transistor and the primary grain boundaries of the N-type thin film transistor are out an angle of about −30° to about 30° with respect to the active channel direction of the N-type thin film transistor.

13. The display device of claim 12, wherein the display device is a liquid crystal display (LCD) device or an organic electroluminescent display device.

14. A method of fabricating a CMOS thin film transistor, the method comprising:
    forming a polysilicon pattern for a N-type thin film transistor and a polysilicon pattern for a P-type thin film transistor on a substrate by crystallizing amorphous silicon using a laser whereby grain boundaries between grains are formed in the polysilicon pattern for the N-type thin film transistor and the polysilicon pattern for the P-type thin film transistor,
    wherein an angle between grain boundaries of the N-type thin film transistor and an active channel region of the N-type thin film transistor is about −30° to about 30° and an angle between grain boundaries of the P-type thin film transistor and an active channel of the P-type thin film transistor is about 60° to about 120°.

15. The method of fabricating a CMOS thin film transistor of claim 14, wherein the angle between the grain boundaries of the N-type thin film transistor and the active channel of the N-type thin film transistor is substantially equal to zero and the angle between the grain boundaries of the P-type thin film transistor and the active channel of the P-type think film transistor is substantially equal to 90°.

16. A CMOS thin film transistor, comprising:
    an active channel of a P-type thin film transistor, the active channel being formed in polycrystalline silicon;
    an active channel of a N-type thin film transistor, the active channel being formed in polycrystalline silicon;
    primary grain boundaries in the P-type thin film transistor; and
    primary grain boundaries in the N-type thin film transistor,
    wherein a direction of the active channel of the P-type transistor is different from a direction of the active channel of the N-type transistor such that the primary grain boundaries of the P-type thin film transistor are at an angle of about 60° to about 120° with respect to the active channel direction of the P-type thin film transistor and the primary grain boundaries of the N-type thin film transistor are out an angle of about −30° to about 30° with respect to the active channel direction of the N-type thin film transistor, and
    wherein the polycrystalline silicon is made by one crystallization method.

17. The CMOS thin film transistor of claim 16, wherein the crystallization method is a sequential lateral solidification (SLS) method.

18. The CMOS thin film transistor of claim 16, wherein the polycrystalline silicon has grains which have the same grain boundary direction.

19. The CMOS thin film transistor of claim 16, wherein the thin film transistors have different channel directions each other.

20. The CMOS thin film transistor of claim 16, wherein the P-type thin film transistor is formed such that it has a high current mobility while the N-type thin film transistor is formed such that it has a low current mobility.

21. The CMOS thin film transistor of claim 16, wherein the P-type thin film transistor is formed such that it has a low threshold voltage while the N-type thin film transistor is formed such that it has a high threshold voltage.

22. The CMOS thin film transistor of claim 16, wherein a length of a channel of the P-type thin film transistor is substantially equal to a length of a channel of the N-type thin film transistor.

* * * * *